US012697658B2

(12) United States Patent
Ivanov et al.

(10) Patent No.: US 12,697,658 B2
(45) Date of Patent: Aug. 4, 2026

(54) TUNGSTEN-BORON SPUTTER TARGETS AND FILMS MADE THEREBY

(71) Applicant: Tosoh SMD, Inc., Grove City, OH (US)

(72) Inventors: Eugene Y. Ivanov, Grove City, OH (US); Eduardo del Rio, Dublin, OH (US)

(73) Assignee: Tosoh SMD, Inc., Grove City, OH (US)

( * ) Notice: Subject to any disclaimer, the term of this patent is extended or adjusted under 35 U.S.C. 154(b) by 788 days.

(21) Appl. No.: 16/305,922

(22) PCT Filed: May 17, 2017

(86) PCT No.: PCT/US2017/033059
§ 371 (c)(1),
(2) Date: Nov. 30, 2018

(87) PCT Pub. No.: WO2017/222682
PCT Pub. Date: Dec. 28, 2017

(65) Prior Publication Data
US 2020/0332410 A1 Oct. 22, 2020

Related U.S. Application Data

(60) Provisional application No. 62/354,214, filed on Jun. 24, 2016.

(51) Int. Cl.
*B22F 1/065* (2022.01)
*C23C 14/06* (2006.01)
*C23C 14/34* (2006.01)

(52) U.S. Cl.
CPC ............ *B22F 1/065* (2022.01); *C23C 14/067* (2013.01); *C23C 14/3414* (2013.01); *B22F 2998/10* (2013.01)

(58) Field of Classification Search
CPC ... C23C 14/3414; C23C 14/067; B22F 1/065; B22F 2998/10; B22F 7/08; B22F 3/14;
(Continued)

(56) References Cited

U.S. PATENT DOCUMENTS 4,209,375 A 6/1980 Gates et al.
4,838,935 A 6/1989 Dunlop et al.
(Continued)

FOREIGN PATENT DOCUMENTS

CN 105692641 A * 6/2016 ............. C01B 35/04
EP 0 840 363 A1 5/1998
(Continued)

OTHER PUBLICATIONS

Shin, et al., WO3 addition, crystal phase evolution and properties of Y2O3-Doped ALN ceramics, 2014, Ceramics—Silikaty, 58(2), 132-137 (Year: 2014).*
(Continued)

*Primary Examiner* — Patrick S Ott
(74) *Attorney, Agent, or Firm* — MCDONALD HOPKINS LLC

(57) ABSTRACT

A Me-B based alloy spherical powder for use in a sputtering target including a metal powder selected from the group consisting of: Mo, W, Ta, Nb, Hf and Ti; a BN powder; and optionally a binary or ternary compound powder, as well as W/B sputter targets, alloys, and barrier/seed films made by such targets. A combined diffusion barrier layer is provided by sputter coating of a W/B sputter target either directly or by reactive sputtering with nitrogen wherein the B content of the alloy is about 0.5 wt %-10 wt %. The oxygen content of the alloy target is about 50 ppm or less. Preferably, the alloy is 99.995% pure.

9 Claims, 2 Drawing Sheets

(58) Field of Classification Search
CPC ..... C22C 1/0458; C22C 1/1084; C22C 1/045;
C22C 1/058
See application file for complete search history.

(56) References Cited

U.S. PATENT DOCUMENTS

| | | | |
|---|---|---|---|
| 5,028,565 | A | 7/1991 | Chang et al. |
| 5,169,832 | A | 12/1992 | Khazai et al. |
| 5,230,459 | A | 7/1993 | Mueller et al. |
| 5,392,981 | A | 2/1995 | Makowiecki et al. |
| 5,487,923 | A | 1/1996 | Min et al. |
| 5,660,599 | A * | 8/1997 | Schlott ................. C04B 35/645 |
| | | | 204/192.1 |
| 5,863,398 | A | 1/1999 | Kardokus et al. |
| 5,916,634 | A | 6/1999 | Fleming et al. |
| 6,066,892 | A | 5/2000 | Ding et al. |
| 6,284,646 | B1 | 9/2001 | Leem |
| 6,328,927 | B1 | 12/2001 | Lo et al. |
| 6,431,800 | B1 * | 8/2002 | Suzuki ................. C04B 35/486 |
| | | | 264/642 |
| 7,341,908 | B2 | 3/2008 | Suh et al. |
| 8,053,773 | B2 | 11/2011 | Shin et al. |
| 9,085,819 | B2 | 7/2015 | Senda et al. |
| 9,150,958 | B1 * | 10/2015 | Juliano .............. C23C 14/3414 |
| 9,231,055 | B2 | 1/2016 | Park |
| 9,243,321 | B2 | 1/2016 | Tendulkar |
| 2003/0059332 | A1 * | 3/2003 | Kobashi ................ C04B 35/581 |
| | | | 428/545 |
| 2006/0170103 | A1 * | 8/2006 | Suh ................... H01L 21/76843 |
| | | | 257/751 |
| 2009/0011266 | A1 * | 1/2009 | Cochran ................ C22C 1/045 |
| | | | 428/545 |
| 2011/0003177 | A1 * | 1/2011 | Wu ........................ G11B 5/658 |
| | | | 419/19 |
| 2013/0109172 | A1 * | 5/2013 | Collins ............ H01L 27/10891 |
| | | | 438/653 |
| 2014/0021043 | A1 * | 1/2014 | Miyashita ............. C22C 1/0466 |
| | | | 419/11 |
| 2014/0027664 | A1 * | 1/2014 | Lei ........................ C23C 16/342 |
| | | | 252/520.5 |
| 2014/0264879 | A1 | 9/2014 | Kuhn et al. |
| 2016/0300686 | A1 * | 10/2016 | Dalakos .................. H01J 35/12 |
| 2017/0088939 | A1 * | 3/2017 | Rachbauer ............ C23C 14/067 |
| 2017/0209954 | A1 * | 7/2017 | Kato ....................... B22F 9/082 |

FOREIGN PATENT DOCUMENTS

| | | | | | |
|---|---|---|---|---|---|
| JP | | 06248446 | A * | 9/1994 | ........ C23C 14/3414 |
| JP | | H 06248446 | A | 9/1994 | |
| JP | | 2008153246 | A * | 7/2008 | |
| KR | | 101278173 | B1 | 7/2013 | |
| WO | WO 2013/143624 | | A2 | 10/2013 | |
| WO | WO-2014065201 | | A1 * | 5/2014 | ............. C22C 33/02 |

OTHER PUBLICATIONS

JP06248446A Translation (Year: 1994).*
CN-105692641-A Translation (Year: 2016).*
JP-2008153246-A Translation (Year: 2008).*
WO-2014065201-A1 Translation (Year: 2014).*
Reid et al., "W-B-N Diffusion Barriers for Si/Cu Metallizations", Thin Solid Films, vol. 262, Issues 1-2, pp. 218-223, Jun. 15, 1995—Abstract.
Leu et al., "Properties of Reactively Sputtered W-B-N Thin Film as a Diffusion Barrier of Cu Metallization on Si", Applied Physics A, 94:691, Mar. 2009—Abstract.
Liu et al., "Effect of Nitrogen Content on Microstructures and Mechanical Properties of WB2(N) Films Deposited by Reactive Magnetron Sputtering", Journal of Materials Science & Technology, vol. 31, Issue 12, pp. 1217-1225, Dec. 2015.
International Search Report and Written Opinion for International Application No. PCT/US2017/033059 dated Jul. 11, 2017, pp. 1-16.

* cited by examiner

Cu film Rs after anneal

TUNGSTEN-BORON SPUTTER TARGETS AND FILMS MADE THEREBY

CROSS REFERENCE TO RELATED APPLICATIONS

This application claims priority to PCT Appl. Serial No. PCT/US2017/033059, filed May 17, 2017, which claims the benefit of U.S. Provisional Patent Application Ser. No. 62/354,214 filed Jun. 24, 2016.

FIELD OF INVENTION

The present invention pertains to a metal-boron based alloy spherical powder or compact for use in a sputtering target, a W—B alloy, a W-WxBy composite sputtering target and to a combined barrier layer for semiconductor and hard coating applications that may be prepared by sputtering of the target either directly or by means of reactive sputtering e.g. with nitrogen.

BACKGROUND OF THE INVENTION

With the recent trend toward production of smaller, miniature interconnects, commensurate increase in interconnect delay time has occurred by reason of increasing interconnect resistance. Increased interconnect delay time results in decreased LSI performance. Consequently, there has been a search to find low resistivity interconnects.

This search has now focused on Cu interconnects, but the use of Cu also raises concerns centered around Cu diffusion through barrier layer materials and poor adhesion of the Cu to insulating films.

In typical Cu interconnect applications, a barrier layer is deposited on an undoped silicon glass (USG) layer via PVD or other appropriate deposition techniques. The barrier layer may comprise, for example, Ta, TiN, or TaN (tantalum nitride). In some applications, the USG layer has a thickness of about 5,000 Å, and the barrier layer normally has a thickness of about 100 Å or less. Next, a Cu seed layer is deposited over the barrier layer by PVD techniques and has a thickness of about 500-1600 Å. One such Cu seed layer is composed of pure Cu or Cu doped with Al, Mn, or Mg. Then, a relatively thick layer of Cu is electroplated over the Cu seed layer using electrochemical plating (ECP) techniques. A chemical polishing of this thick Cu layer results in a planarized wafer with a reduced Cu layer then having a thickness of about 3,000 Å.

Desirably, attempts have been made to reduce the thicknesses of the barrier and copper seed layer in order to reduce the resistivities thereof to result in a reduced resistance interconnect. If a single layer could serve to both inhibit Cu diffusion (i.e., acts as a barrier layer) and promote adhesion of the Cu interconnect material, the overall resistance of the interconnect or plug can be reduced commensurately. However, this is not always possible and so thinner barrier layer with improved barrier properties is also desired.

Usually, very thin barrier layer tend to fail at relatively low temperature, around 350° C., so better barrier properties using more stable layers are desired. One good candidate is WBN layer, however, published data showed that this layer can be only deposited from W boride targets under reactive sputtering, or CVD process using Borane gas and nitrogen so W—B target would have benefit of simplified WBN layer deposition. The goal of this invention is to produce fully dense W—B target material suitable for either direct or reactive sputtering.

SUMMARY OF THE INVENTION

In one exemplary embodiment, a Me-B based alloy spherical powder is provided. The Me-B based alloy spherical powder comprises a metal powder, wherein the metal powder is selected from the group consisting of: Mo, W, Ta, Nb, Hf and Ti; a BN powder; and optionally a binary or ternary compound powder. The B is provided by the decomposition reaction of the BN powder according to the following:

$$2W+BN \rightarrow W_2B + \frac{1}{2}N_2.$$

In another embodiment, a method of manufacturing a Me-B based alloy solid compact for use in a sputtering target is provided. The method for manufacturing a Me-B based alloy solid compact comprises the steps of: (a) blending desired amounts of a metal powder, a BN powder and optionally a binary or ternary compound powder to form a composite; (b) hot pressing the composite under vacuum to about 1350° C. or more to about 1750° C. or less to make tight blank; and (c) providing a desired final shape and bonding of the target blank to an appropriate substrate. In some embodiments, after step b), the target blank is formed into a desired final shape. In some embodiments, the target blank is machined into a desired final shape.

In some embodiments, the method of manufacturing the Me-B based alloy comprises a metal powder that is Ta powder. In other embodiments, the metal powder is Mo powder and includes a compound powder that is $Si_3N_4$ powder. In other embodiments, the metal powder is W powder. In other embodiments, the method further comprises the step of atomizing the target blank to produce a spherical powder useful for the additive manufacturing process.

In one exemplary embodiment, a sputter target is provided that comprises W/B composite alloy wherein the B content is about 0.1 wt %-about 20 wt %. The oxygen content of the W/B composite alloy sputter target is about 50 ppm or less. In another exemplary embodiment, the B content is about 1-about 5 wt %. The uniformity of the B content in the target is within +/−5%, and in an even more preferred embodiment, the uniformity of the B content is within +/−3%. In yet another embodiment, the W/B sputter target comprises a B content of about 1 wt %.

In other varying aspects of the invention, a W/B alloy composition is provided wherein the B content of the alloy is about 1 wt % or less and wherein the oxygen content of the alloy is about 50 ppm or less and nitrogen content is 10 ppm or less.

Additionally, the invention pertains to methods for fabricating a semiconductor device comprising the steps of forming a trench in an interlayer dielectric formed on a substrate. The trench and its inner and bottom walls thereof are covered with a combined barrier/Cu seed film wherein the barrier seed film is a W/B alloy film having a B content of about 1 wt %-about 20 wt % and an oxygen content of about 50 ppm or less. A layer of Cu is then applied in the trench by forming the Cu layer directly on a surface of the barrier seed film. It is understood W/B targets can be used as conventional barrier material with Cu seed layer deposited on it. In some embodiments, the B is provided by the decomposition reaction of the BN powder according to the following:

$$2W+BN \rightarrow W_2B + \frac{1}{2}N_2.$$

DETAILED DESCRIPTION

Figure 1:
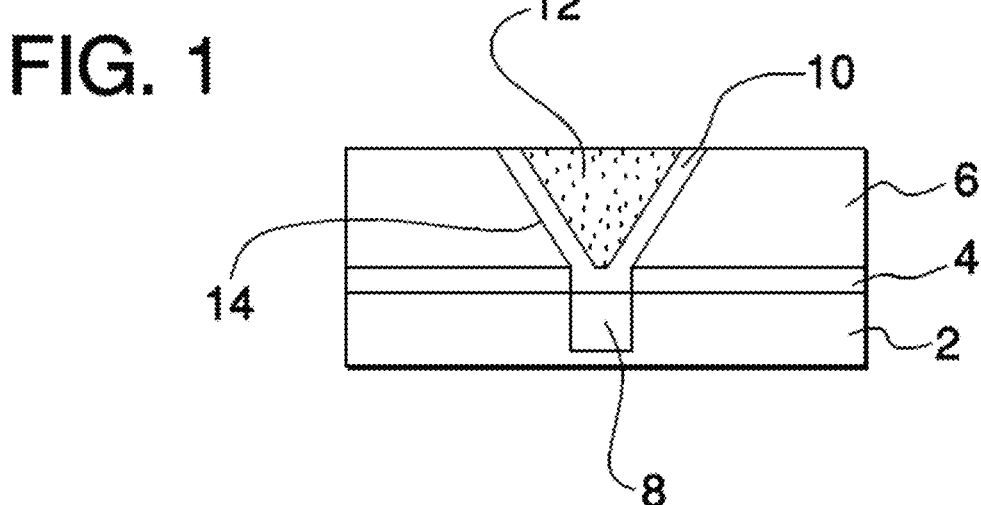
FIG. 1 is a simplified schematic cross sectional view of a semiconductor wafer having a Cu interconnect bordered by a combined diffusion barrier/Cu seed layer in accordance with the invention.

The invention will now be described in the following detailed description with reference to the drawing(s), wherein preferred embodiments are described in detail to enable practice of the invention. Although the invention is described with reference to these specific preferred embodiments, it will be understood that the invention is not limited to these preferred embodiments. But to the contrary, the invention includes numerous alternatives, modifications and equivalents as will become apparent from consideration of the following detailed description.

Approximating language, as used herein throughout the specification and claims, may be applied to modify any quantitative representation that could permissibly vary without resulting in a change in the basic function to which it is related. Accordingly, a value modified by a term or terms, such as "about", is not limited to the precise value specified. In at least some instances, the approximating language may correspond to the precision of an instrument for measuring the value. Range limitations may be combined and/or interchanged, and such ranges are identified and include all the sub-ranges included herein unless context or language indicates otherwise. Other than in the operating examples or where otherwise indicated, all numbers or expressions referring to quantities of ingredients, reaction conditions and the like, used in the specification and the claims, are to be understood as modified in all instances by the term "about".

"Optional" or "optionally" means that the subsequently described event or circumstance may or may not occur, or that the subsequently identified material may or may not be present, and that the description includes instances where the event or circumstance occurs or where the material is present, and instances where the event or circumstance does not occur or the material is not present.

The singular forms "a," "an" and "the" include plural referents unless the context clearly dictates otherwise. The endpoints of all ranges reciting the same characteristic are independently combinable and inclusive of the recited endpoint. All references are incorporated herein by reference.

The terms "comprises", "comprising", "includes", "including", "has", "having", "containing", "contains" or any other variation thereof, are intended to cover a non-exclusive inclusion. For example, a process, method, article or apparatus that comprises a list of elements is not necessarily limited to only those elements, but may include other elements not expressly listed or inherent to such process, method, article or apparatus.

In one aspect of the invention, a metal-boron (Me-B) based alloy spherical powder is disclosed. In some embodiments, the Me-B based alloy spherical powder is used to form a solid compact. The Me-B based alloy spherical powder comprises a metal powder, a BN powder and optionally a binary or ternary compound powder. The metal powder is selected from the group consisting of Mo, W, Ta, Nb, Hf, and Ti.

The Me-B based alloy spherical powder utilizes BN instead of B powder, wherein B is provided by the decomposition reaction of BN above 1600° C. according to the following:

$$2W + BN \rightarrow W_2B + \frac{1}{2}N_2$$

forming a W2B intermetallic compound between freshly formed boron and available tungsten material.

Mo—Si—B Alloys

In some embodiments, the Me-B based alloy spherical powder is a Mo—Si—B based alloy spherical powder. The Mo—Si—B based alloy spherical powder includes a ternary compound comprising $Mo_5SiB_2$. In such embodiments, the Mo—Si—B based alloy spherical powder includes $Mo_5SiB_2$ as a main component. In some embodiments, the Mo—Si—B based alloy is in a compact.

In some embodiments where the Me-B based alloy spherical powder is a Mo—Si—B based alloy spherical powder, the B content is about 0.01 mass % or more, and in other embodiments, the B content is about 5 mass % or less. In some embodiments where the Me-B based alloy spherical powder is a Mo—Si—B based alloy spherical powder, the Si content is about 0.05 mass % or more, and in other embodiments the Si content is about 5 mass % or less.

In some embodiments where the Me-B based alloy spherical powder is a Mo—Si—B based alloy spherical powder, the B content is in the range of about 0.01 mass % or more to about 5 mass % or less, the Si content is in the range of about 0.05 mass % or more to about 5 mass % or less, and the balance is Mo and an inevitable impurity.

In some embodiments where the Me-B based alloy spherical powder is a Mo—Si—B based alloy spherical powder, the O content is about 100 mass ppm or more, and in other embodiments, the O content is about 500 mass ppm or less. In some embodiments where the Me-B based alloy spherical powder is a Mo—Si—B based alloy spherical powder, the C content is about 50 mass ppm or more, and in other embodiments, the C content is about 100 mass ppm or less.

In some embodiments where the Me-B based alloy spherical powder is a Mo—Si—B based alloy spherical powder, the O content is in the range of about 100 mass ppm or more to about 500 mass ppm or less, the C content is in the range of about 50 mass ppm or more to about 100 mass ppm or less, and the balance is an inevitable compound with an inevitable impurity.

In another embodiment, a method of manufacturing a Mo—Si—B based spherical alloy compact is described. The method of manufacturing a Mo—Si—B based spherical alloy compact includes mixing a Mo powder, a BN powder and a $Si_3N_4$ powder as raw materials. The Mo powder, the BN powder and $Si_3N_4$ powder are mixed in a mixing ratio, such as from about 3:1:1 to 6:1:3. The mixed powder is then heat treated to a temperature of about 1350° C. or more to about 1750° C. or less in a vacuum. Heat treatment may include hot pressing or disintegration treatment in a vacuum at a temperature above 1600° C. to make a tight blank. Additionally, a step of atomizing the obtained solid preform or tight blank to produce spherical powder useful for additive manufacturing process is performed.

Ta—B—N Alloys

In some embodiments, the Me-B based alloy spherical powder is a Ta—B—N based alloy spherical powder. The Ta—B—N based alloy spherical powder includes a ternary compound comprising TaBN. In such embodiments, the Ta—B—N based alloy spherical powder includes TaBN as a main component. In some embodiments, the Ta—B—N based alloy spherical powder is in a compact.

In some embodiments where the Me-B based alloy spherical powder is in a Ta—B—N based alloy compact, the B content is about 0.01 mass % or more, and in other embodiments, the B content is about 5 mass % or less. In some embodiments where the Me-B based alloy spherical powder is in a Ta—B—N based alloy compact, the N content is about 2 mass % or more, and in other embodiments, the N content is about 5 mass % or less.

In some embodiments where the Me-B based alloy spherical powder is in a Ta—B—N based alloy compact, the B content is about 0.01 mass % or more to about 5 mass % or less, the N content is about 2 mass % or more to about 5 mass % or less, and the balance is Ta and an inevitable impurity.

In some embodiments where the Me-B based alloy spherical powder is in a Ta—B—N based alloy compact, the O content is about 100 mass ppm or more, and in other embodiments, the O content is about 1500 mass ppm or less. In some embodiments where the Me-B based alloy spherical powder is in a Ta—B—N based alloy compact, the C content is about 100 mass ppm or more, and in other embodiments, the C content is about 1000 mass ppm or less.

In some embodiments where the Me-B based alloy spherical powder is a Ta—B—N based alloy spherical powder, the O content is about 100 mass ppm or more to about 1500 mass ppm or less, the C content is about 100 mass ppm or more to about 1000 mass ppm or less.

In another embodiment, a method of manufacturing a Ta—B—N based spherical alloy compact is described. The method of manufacturing a Ta—B—N based spherical alloy compact includes mixing a Ta powder and a BN powder as raw materials. The Ta powder and the BN powder are mixed in a mixing ratio, such as from about 1:0.01 to 1:1. The mixed powder is then heat treated to a temperature of about 1350° C. or more to about 1750° C. or less in a vacuum. Heat treatment may include hot pressing or disintegration treatment in a vacuum at a temperature above 1600° C. to make a tight blank.

W—B Alloys

In some embodiments, the Me-B based alloy spherical powder is a W—B based alloy spherical powder. In some embodiments, the W—B spherical powder includes a binary compound comprising $W_2B$. In such embodiments, the W—B based alloy spherical powder includes $W_2B$ as a main component. In some embodiments, the W—B based alloy is in a compact.

In some embodiments where the Me-B based alloy spherical powder is a W—B based alloy spherical powder, the B content is about 0.1 mass % or more, and in other embodiments, the B content is about 20 mass % or less. In some embodiments, the B content is about 0.1 mass % or more to about 20 mass % or less, and the balance is W and an inevitable impurity.

In some embodiments where the Me-B based alloy spherical powder is in a W—B based alloy compact, the O content is about 10 mass ppm or more, and in other embodiments, the O content is about 100 mass ppm or less. In some embodiments where the Me-B based alloy spherical powder is in a W—B based alloy compact, the C content is about 50 mass ppm or more, and in other embodiments, the C content is about 100 mass ppm or less.

In some embodiments where the Me-B based alloy spherical powder is in a W—B based alloy compact, the O content is about 10 mass ppm or more to about 100 mass ppm or less, the C content is about 50 mass ppm or more to about 100 mass ppm or less.

In another embodiment, a method of manufacturing a W—B based spherical alloy compact is described. The method of manufacturing a W—B based spherical alloy compact includes mixing a W powder and a BN powder as raw materials. The W powder and the BN powder are mixed in a mixing ratio, such as from about 1:0.01 to 1:1. The mixed powder is then heat treated to a temperature of about 1350° C. or more to about 1750° C. or less in a vacuum. Heat treatment may include hot pressing or disintegration treatment in a vacuum at a temperature above 1600° C. to make a tight blank.

In another aspect of the invention, W/B alloys and alloy targets are disclosed. The W/B alloys and alloy targets can be prepared by a conventional powder sintering technique. For example, using powder metallurgical methods, the requisite amounts of W and B powder are blended and then may be pressured consolidated by HIPing, or hot press methods. The final shape can be imparted to the target via light machining. However, this method has two major problems: blending W and B powders is not an easy task and also full densification of blended composition cannot be achieved due to high melting point of the constituents.

Preferably according to this invention, the W/B alloy target may be produced by blending W powder and BN powder to the requisite, desired weight ratio to form an ingot of the alloy by consolidation in a hot press. The unexpected benefit of using BN instead of B powder is that the B is provided by the decomposition reaction of BN above 1600° C. according to the following:

$$2W+BN \rightarrow W_2B + \frac{1}{2}N_2$$

forming a W2B intermetallic compound between freshly formed boron and available tungsten material. Additional benefit of this reaction is removing surface impurities from W powder surface by flow of clean nitrogen gas. As tungsten nitrides are not stable at these temperatures, final nitrogen content in W/B composite is very low, typically below 20 ppm.

Once made, the targets may be bonded to suitable backing plate materials, such as Al or Al alloys or Cu and Cu alloys by diffusion bonding or other conventional techniques.

In one exemplary embodiment, the uniformity of the B throughout the target is controlled so that it is within +/−5%, preferably +/−3%, throughout the whole target. This can be controlled by careful blending of powders using specifically developed blending procedure.

The oxygen content of the alloy is also controlled carefully so that the targets and films sputtered thereby having an oxygen content of about 50 ppm or less.

The W/B alloy sputter targets may be used for PVD deposit of a barrier layer on the desired substrate. This sputtering can be done as using W/B to form WB layer or by reactive sputtering under nitrogen to form WBN layer For example, and as shown in the exemplary embodiment of FIG. 1, a simplified semiconductor comprises a $SiO_2$ wafer 2 with overlying dielectric layer 4 is provided. A conductor 8 is embedded in the wafer with its top surface exposed. As shown, a substantially concave sectioned trench 14 is formed in the dielectric layer 6 with the trench covered on its inner walls by the combined barrier/Cu seed layer in accordance with the invention. The combined barrier/Cu seed layer 10 covers the walls and bottom flat surface of the trench, serving as a diffusion barrier inhibiting Cu migration while providing an adhesive seed layer for thick Cu interconnect layer 12 that is typically electroplated over the layer 10.

Figure 2:
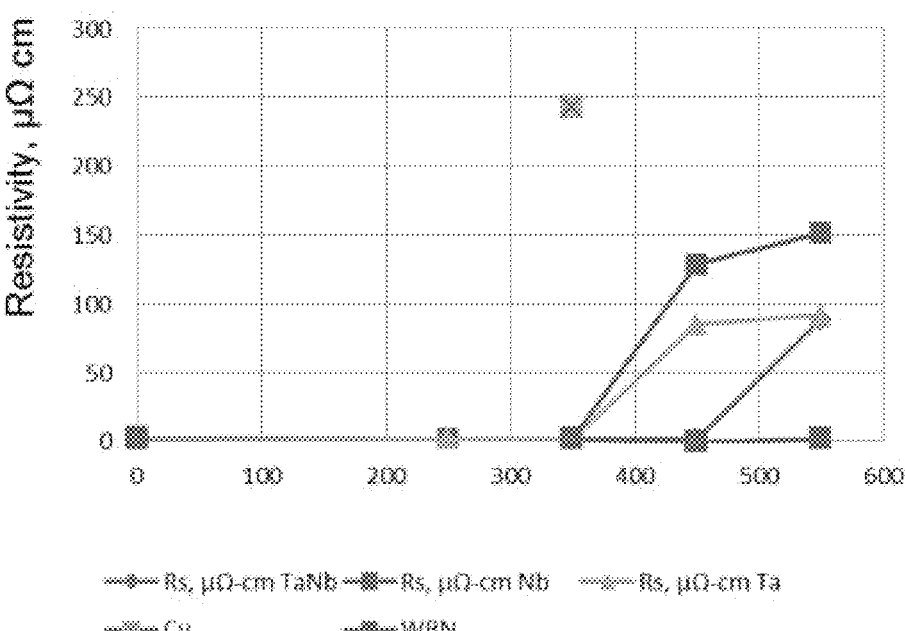
FIG. 2 is a graph comparing resistivity of films sputtered with conventional Ta and Nb and Ta40% Nb sputter targets and a W/B sputter target in accordance with the invention, the latter composed of a W/B 1.44 wt % alloy target.

In accordance with the above, a thin barrier film is provided with improved barrier performance. The benefit of this film is that it functions as a Cu diffusion barrier at high temperature while being very thin compared to a conventional Ta based barrier, thus providing more volume to a copper interconnect and improving overall device performance. Although applicant is not to be bound to any theory of operation, typical Ta based barrier films have high resistivity in the range of ≈200 Ohm/cm due to the presence of beta Ta phase in the film and fails at 450 C. FIG. 2 shows barrier properties of different barrier layers in comparison.

FIG. 2 barrier properties of WBN layer in comparison with other barriers. 1000A barrier layer was deposited on bare silicon wafer, a copper layer was deposited on top of the barrier layer. This combination was subjected to 30 min anneal at different temperatures. As silicon-copper capable to interdiffuse through the barrier to form low resistivity Cu silicide, measured Cu layer resistivity typically increases. These different layers can fail at different temperatures, the better barrier falls at higher temperature all conditions.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A method of manufacturing a Me-B based alloy solid compact for use in a sputtering target, comprising:
   (a) blending desired amounts of a metal powder comprising W, Ta, or Mo, a BN powder and optionally a $Si_3N_4$ ternary compound powder to form a composite, wherein:
      (i) when said metal powder comprises W or Ta, said metal powder and said BN powder are mixed in a mixing ratio from about 1:0.01 to 1:1, and
      (ii) when said metal powder comprises Mo and said optional tenary compound power comprises $Si_3N_4$, said metal powder, said BN powder, and said $Si_3N_4$ powder are mixed in a mixing ratio from about 3:1:1 to 6:1:3;
   (b) hot pressing said composite under vacuum to between about 1350° C.-1750° C. to make a target blank; and
   (c) providing a desired final shape and bonding of said target blank to an appropriate substrate, wherein a uniformity of said B content in said target blank is within +/−5%;
   wherein, when said metal powder comprises W and the hot pressing is conducted above 1600° C., B and a flow of N gas are provided by a decomposition reaction of said BN powder and the flow of N gas removes surface impurities from said W powder.

2. The method as recited in claim 1, further comprising atomizing said target blank to produce a spherical powder useful for an additive manufacturing process.

3. The method as recited in claim 1, wherein said target blank is machined into said desired final shape.

4. A method of manufacturing of W/B composite target comprising of following steps:
   a) blending desired amounts of W powder and BN powder to produce a W/BN blend, wherein said W/BN blend is devoid of B powder, wherein said W powder and said BN powder are mixed in a mixing ratio from about 1:0.01 to 1:1;
   b) hot pressing said W/BN blend under vacuum at temperature above 1600° C. to make a target blank, wherein surface impurities are removed from said W powder of said W/BN blend by flow of N gas; and
   c) providing a desired final shape and bonding of said target blank to an appropriate substrate to form said W/B composite target, wherein a final N content in said W/B composite target is below 20 ppm.

5. The method as recited in claim 4, wherein after said step b), said target blank is formed into said desired final shape.

6. The method as recited in claim 5, wherein said target blank is machined into said desired final shape.

7. The method as recited in claim 4, wherein B and said flow of N gas are provided by a decomposition reaction of said BN powder.

8. A method of covering a trench using a target blank:
   said method comprising covering, by atomizing said target blank, a trench having at least one wall in an interlayer dielectric formed on a substrate to form a barrier film on said trench and said at least one wall during fabrication of a semiconductor device, wherein said barrier film is a W/B/N alloy film having a boron content of about 1 wt %-10 wt % and an oxygen content of about 50 mass ppm or less;
   said target blank is manufactured from a Me-B based alloy solid compact using a method comprising:
   (a) blending desired amounts of a metal powder and a BN powder to form a composite,
      wherein said metal powder comprises W and said metal powder and said BN powder are mixed in a mixing ratio from about 1:0.01 to 1:1;
   (b) hot pressing said composite under vacuum to between about 1350° C.-1750° C. to make a target blank;
   (c) providing a desired final shape and bonding of said target blank to an appropriate substrate, wherein a uniformity of said B content in said target blank is within +/−5%;
   wherein, when the hot pressing is conducted above 1600° C., B and a flow of N gas are provided by a decomposition reaction of said BN powder and the flow of N gas removes surface impurities from said W powder.

9. The method as recited in claim 8, wherein said target blank is machined into said desired final shape.

* * * * *